(12) United States Patent
Terano et al.

(10) Patent No.: US 8,476,731 B2
(45) Date of Patent: Jul. 2, 2013

(54) NITRIDE SEMICONDUCTOR DIODE

(75) Inventors: Akihisa Terano, Hachioji (JP);
Kazuhiro Mochizuki, Tokyo (JP);
Takashi Ishigaki, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/349,959

(22) Filed: Jan. 13, 2012

(65) Prior Publication Data
US 2012/0223337 A1  Sep. 6, 2012

(30) Foreign Application Priority Data
Mar. 4, 2011  (JP) ................. 2011-047107

(51) Int. Cl.
*H01L 29/47* (2006.01)
*H01L 29/40* (2006.01)

(52) U.S. Cl.
USPC .... 257/472; 257/485; 257/486; 257/E29.149; 257/E29.338

(58) Field of Classification Search
USPC ........... 257/472, 485, 486, E29.149, E29.338
See application file for complete search history.

(56) References Cited

U.S. PATENT DOCUMENTS

| 7,531,889 | B2 | 5/2009 | Kiyama et al. | |
| 7,679,104 | B2 | 3/2010 | Sato et al. | |
| 7,763,892 | B2* | 7/2010 | Miura et al. | 257/76 |
| 2008/0217625 | A1* | 9/2008 | Kuroda et al. | 257/76 |
| 2012/0056197 | A1* | 3/2012 | Mizukami et al. | 257/77 |
| 2012/0146096 | A1* | 6/2012 | Park et al. | 257/194 |
| 2013/0001729 | A1* | 1/2013 | Kurfiss et al. | 257/436 |

FOREIGN PATENT DOCUMENTS
JP  2006-100801 A  4/2006
JP  2008-124137 A  5/2008

* cited by examiner

*Primary Examiner* — Ngan Ngo
(74) *Attorney, Agent, or Firm* — Miles & Stockbridge P.C.

(57) ABSTRACT

In a Schottky electrode formation region on a nitride semiconductor, the total length of junctions of Schottky electrodes and a surface of a nitride semiconductor layer is longer than the perimeter of the Schottky electrode formation region. The total length is preferably 10 times longer than the perimeter. For example, the Schottky electrodes are formed concentrically and circularly.

17 Claims, 12 Drawing Sheets

NITRIDE SEMICONDUCTOR DIODE

CLAIM OF PRIORITY

The present application claims priority from Japanese patent application JP 2011-047107 filed on Mar. 4, 2011, the content of which is hereby incorporated by reference into this application.

FIELD OF THE INVENTION

The present invention is relates to a nitride semiconductor diode including an anode electrode in Schottky contact with a nitride semiconductor.

BACKGROUND OF THE INVENTION

Japanese Unexamined Patent Application Publication No. 2006-100801 discloses a vertical Schottky barrier diode including a low-concentration n-type GaN drift layer disposed on a low-dislocation-density GaN substrate, a Schottky electrode disposed on the drift layer, and an ohmic electrode (cathode electrode) disposed on the back surface of the n-type GaN substrate. This related-art example also discloses that use of the low-dislocation GaN substrate as a substrate in the Schottky barrier diode reduces dislocation within the drift layer composed of a low-concentration GaN layer epitaxially grown on the GaN substrate, controlling increases in backward leakage current caused by dislocation and thus improving the backward withstand voltage. This related-art example also discloses that use of the GaN substrate allows epitaxial growth of a sufficiently thick drift layer without causing degradation of crystal quality, making it easy to design the thickness and carrier concentration of a drift layer which causes no punch through and is intended for ideal breakdown.

Japanese Unexamined Patent Application Publication No. 2008-124137 discloses a vertical Schottky barrier diode that uses an n-type silicon substrate as a substrate for cost reduction and includes: a convex selectively-grown nitride semiconductor layer that is disposed on the n-type silicon substrate, composed of multiple nitride semiconductors, and has a thickness of 10 µm or more; anode electrodes in Schottky contact with the crests of the convex selectively-grown nitride semiconductor layers; cathode electrodes in ohmic contact with the back surface of the n-type silicon substrate; an insulating film for filling and flattening recesses formed on sides of the adjacent concave selectively-grown nitride semiconductor layers, and wiring lines for electrically connecting the anode electrodes formed on the convex selectively-grown nitride semiconductor layers. This related-art example also discloses that use, as a carrier layer, of the nitride semiconductor layer convexly selectively grown on the low-cost silicon substrate can suppress the effect of the difference in thermal expansion between the carrier layer and the substrate, which can grow a film having a thickness of 10 µm or more without making cracks on the convex nitride semiconductor layer and thus improve the withstand voltage of the diode.

SUMMARY OF THE INVENTION

Japanese Unexamined Patent Application Publication No. 2006-100801 has a big advantage since it uses a GaN substrate having a low crystal defect density or a low dislocation density in order to solve the problem with the backward withstand voltage. However, a GaN substrate is much more expensive than a silicon substrate and the like. For example, putting a Schottky barrier diode manufactured using a GaN substrate into commercial production requires reducing the chip area as much as possible to reduce the substrate cost. For the vertical Schottky barrier diode described in this related-art example, where the anode electrode (Schottky electrode) and the cathode electrode (ohmic electrode) are disposed on the front and back surfaces of the substrate and a current vertically flows, the forward characteristics of the diode are roughly determined by the carrier concentration and thickness of the drift layer and the area of the Schottky junction of the anode electrode and the drift layer, that is, by the resistance components in the vertical direction of the drift layer between the anode and cathode electrodes.

On the other hand, the backward withstand voltage characteristics are roughly determined by the carrier concentration and thickness of the drift layer. To obtain high withstand voltage characteristics, a low-carrier-concentration, thick drift layer is usually used. Since such backward withstand voltage characteristics act as significant resistance components for the forward characteristics, obtaining a large forward current requires a Schottky junction having a large area. In other words, since a region for forming a Schottky electrode having a large area (hereafter referred to as a "Schottky electrode formation region") is required on one semiconductor surface of the diode chip, the area and size of the diode chip are determined by the area of the Schottky electrode formation region. Disadvantageously, this makes it difficult to achieve both acquisition of a large forward current and a reduction in chip area.

The Japanese Unexamined Patent Application Publication No. 2008-124137 uses not an expensive GaN substrate but a low-cost silicon substrate as a substrate material so as to reduce cost. However, this related are example requires complicated, technologically difficult processes, such as one using a technology for uniformly selectively growing a nitride semiconductor film on a silicon substrate and one using a technology for filling and flattening recesses formed on sides of convex selectively-grown nitride semiconductor layers having a height of as high as 10 µm. Such technological difficulty makes high-yield, easy production difficult. Further, since the chip area is increased by the silicon substrate region other than the convex nitride semiconductor, the chip area is difficult to reduce. As seen, it is difficult to reduce cost for the reason different from the structure of Japanese Unexamined Patent Application Publication No. 2006-100801.

A nitride semiconductor diode according to an aspect of the present invention includes: a substrate; an n-conductivity-type nitride semiconductor layer disposed on a substrate; a Schottky electrode that is disposed on a surface of the nitride semiconductor layer and makes a Schottky junction with the surface of the nitride semiconductor layer; and an ohmic electrode in ohmic contact with the nitride semiconductor layer. A length of an edge of the Schottky electrode in contact with the surface of the nitride semiconductor layer, is longer than a perimeter of a Schottky electrode formation region of the Schottky electrode.

If the Schottky electrode comprises a plurality of electrodes, the perimeter is preferably the shortest length of a shape surrounding all the Schottky electrodes when seen from above. If a recess is formed on the nitride semiconductor layer, the perimeter is preferably the shortest of respective lengths of shapes surrounding a drift layer formed outside a region having the recess formed thereon when seen from above.

According to the configuration of the aspect of the present invention, a nitride semiconductor diode can be provided which can obtain a larger forward current than that of a conventional diode even when the area and size of the chip are the same as those of the conventional diode. Further, according to the configuration of the aspect of the present invention, a nitride semiconductor diode can be provided that can obtain the same magnitude of forward current as that of a conventional one even when the chip area is small. Further, a low-cost nitride semiconductor diode can be provided.

DETAILED DESCRIPTION OF THE PREFERRED EMBODIMENTS

First, the result of an experiment conducted by the inventors will be described. The inventors prototyped a vertical Schottky barrier diode using a GaN substrate having an epitaxial structure similar to the configuration described in Japanese Unexamined Patent Application Publication No. 2006-100801. They then actually measured diode characteristics using, as a parameter, the sizes of the Schottky electrodes (equal to the areas of the Schottky junctions) serving as the anode electrode and examined a forward voltage-current density characteristic from the diode characteristics. The result is shown in Table 13. The diode epitaxial substrate used in this experiment was obtained by epitaxially growing a low-concentration n-type GaN drift layer on an n-type GaN substrate. The carrier concentration of the low-concentration n-type GaN drift layer was $5 \times 10^{15}$ cm$^{-3}$, and the thickness thereof was 10 μm.

The Schottky electrodes serving as a parameter were circular and their diameters are 100 μm (characteristic line 1), 200 μm (characteristic line 2), 300 μm (characteristic line 3), 400 μm (characteristic line 4), and 500 μm (characteristic line 5). Schottky electrode metals were each a 200-nm-thick Pd monolayer. Disposed on the back of the n-type GaN substrate was a Ti/Al ohmic electrode serving as a cathode electrode.

Figure 13:
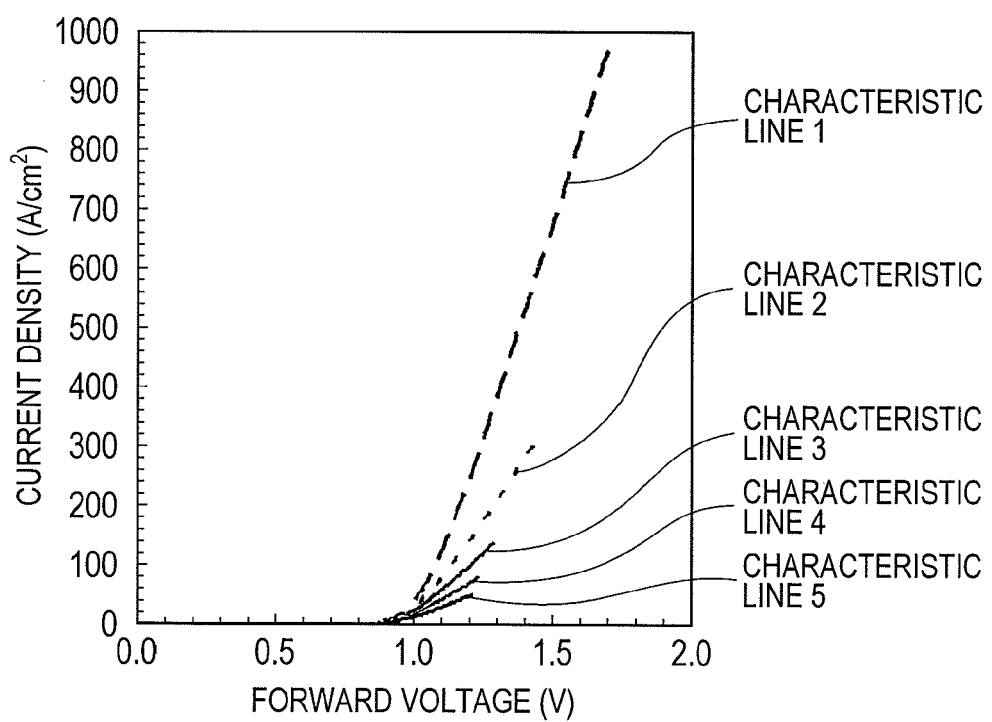
FIG. 13 is a graph showing a forward voltage-current density characteristic of a vertical diode having a conventional structure.

FIG. 13 indicates that a different forward voltage-current density characteristic was exhibited for each electrode size and that a Schottky electrode having a smaller size had a lower element resistance and a higher current density. Specifically, in the characteristic line 1 (Schottky electrode size: 100 μm), a current of about 700 A was obtained at a forward voltage of 1.5 V; in the characteristic line 2 (Schottky electrode size: 200 μm), only about half that current was obtained at a forward voltage of 1.5 V. Similarly, as shown in the characteristic lines 3 to 5, a larger electrode size obtained a lower current value at the same forward voltage. On the other hand, this experiment result did not lead to correct estimation of the element resistance per unit area or current density per unit area.

This experiment result indicates that, in the conventional vertical Schottky barrier diode using a nitride semiconductor, the forward voltage did not increase in proportionate to the area of the Schottky junction, unlike in a conventional vertical Schottky barrier diode using silicon and that necessary device parameters is thus impossible to obtain. Accordingly, the inventors found that it is difficult to properly design a device for cost reduction and that there is a big problem with the manufacture of a nitride semiconductor Schottky barrier diode which is driven by a large current.

Figure 14:
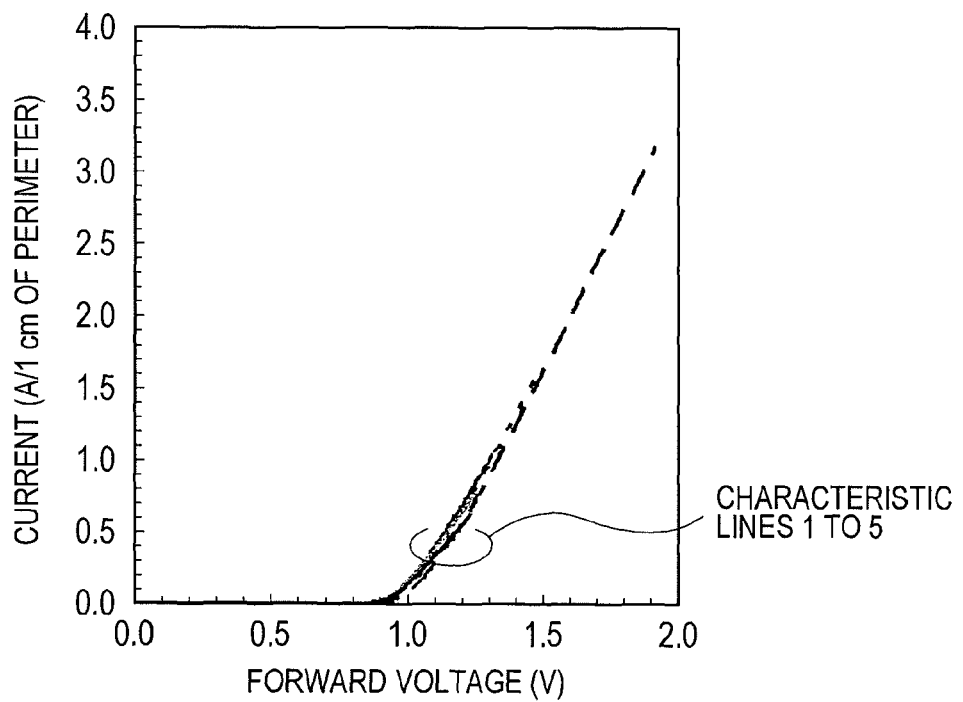
FIG. 14 is a graph showing a forward voltage-Schottky electrode edge unit length current characteristic of the vertical diode having a conventional structure.

Next, to investigate the cause of the differences in current density between the electrode sizes, the inventors converted the actually measured forward characteristic for each electrode size into the forward voltage vs. the current per unit length (1 cm) of the edge of the Schottky electrode at the nitride semiconductor/Schottky electrode junction and graphed the conversion results in FIG. 14. As shown in FIG. 14, all the Schottky electrode sizes exhibited almost the same characteristic.

The forward current of a Schottky barrier diode is generally known to flow uniformly through the entire electrode surface in Schottky contact with the semiconductor. However, the experiment conducted by the inventors suggested that the magnitude of the forward current of the vertical Schottky barrier diode made using at least the nitride semiconductor GaN depended not on the area of the Schottky electrode but on the length of the edge of the Schottky electrode at the nitride semiconductor/Schottky electrode junction, that is, the forward current flowed mainly through the edge of the Schottky electrode in contact with the nitride semiconductor.

To check the authenticity of this phenomenon, the inventors made 16 Schottky electrodes including Pd and having a diameter of 100 μm and a thickness of 200 nm separately on a surface of a nitride semiconductor using the same substrate as the diode epitaxial substrate used in the experiment. Then by electrically connecting the Schottky electrodes in parallel by metal wiring, they prototyped a vertical Schottky barrier diode including an anode electrode. The metal wiring was formed in such a manner that it did not come into contact with the surface of the nitride semiconductor. With regard to this anode electrode, the total length (perimeter) of the edges of the Schottky electrodes at the nitride semiconductor/Schottky electrode junctions was about four times longer than that of the above-mentioned Schottky electrode having a diameter of 400 μm. On the other hand, the total area of the Schottky junctions was the same as the area of the electrode having a diameter of 400 μm.

Figure 15:
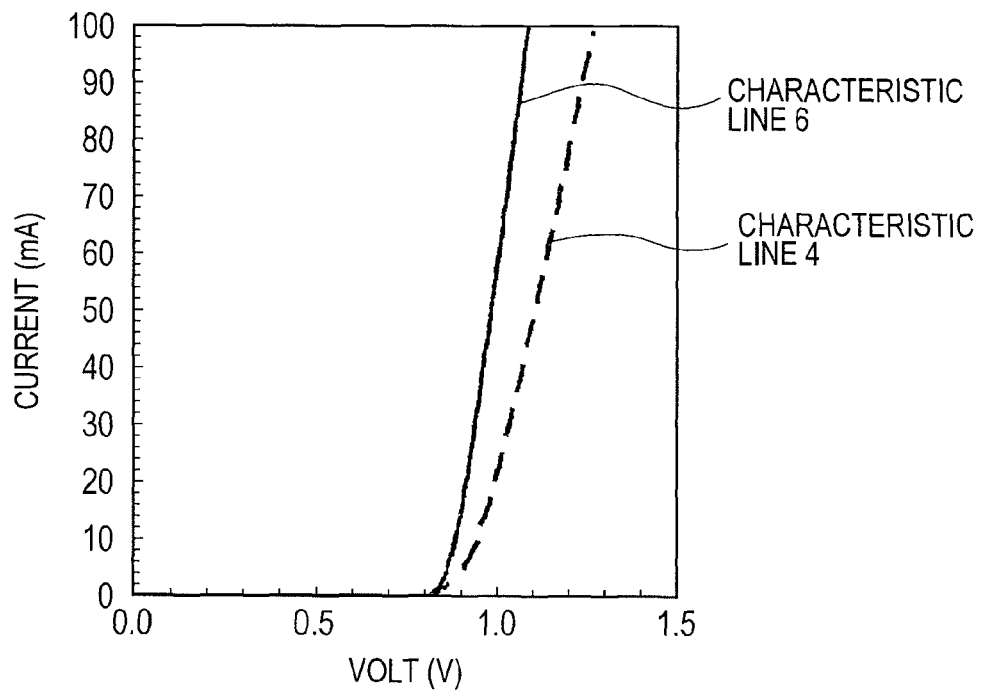
FIG. 15 is a graph showing the result of an experiment (current-voltage characteristic) conducted to verity an advantage of a Schottky electrode structure according to the present invention.

An evaluation result of the forward characteristic of the diode having the 16 Schottky junctions each having a diameter of 100 μm is shown in FIG. 15. FIG. 15 indicates that, compared to the characteristic line 4 representing the conventional diode including the Schottky electrode having a diameter of 400 μm, a characteristic line 6 representing the abovementioned diode having the 16 Schottky junctions each having a diameter of 100 μm apparently had an inclination close to verticality and that the diode represented by the characteristic line 6 thus had a lower element resistance than the conventional diode represented by the characteristic line 4.

Here it is estimated that, due to the phenomenon where the forward current flows mainly through the edge of the Schottky electrode, increasing the total length of the edges of the Schottky electrodes in Schottky contact with the nitride semiconductor advantageously reduced the element resistance even when the total area of the Schottky junctions with the nitride semiconductor was the same.

Further, eight Schottky electrodes having the above-mentioned structure were connected together and measured. As a result, approximately the same element resistance characteristic was shown, whereas the rising voltage increased by about 0.1 to 0.15 V. The total area of the Schottky junctions of the connected eight Schottky electrodes was half that of the conventional Schottky electrode. These results suggest that this increase in rising voltage was caused by the reduction in the area of the Schottky junction and that, by increasing the length of the edge of the Schottky contact electrode, the element resistance of a diode can be made lower than that of a conventional simple diode including a single circular Schottky electrode, although the rising voltage of the current is slightly increased by a reduction in the area of the Schottky junction.

The inventors thus found that, to reduce the element resistance without increasing the rising voltage of the diode, it is extremely effective to increase the length of the edge of the Schottky electrode in Schottky contact with the nitride semiconductor as much as possible without reducing the area of the Schottky junction if possible.

Accordingly, the inventors found the following: even if the chip area is small, the element resistance can be made lower than that of a conventional diode by making a relatively simple shape or disposition improvement in the Schottky electrode to increase the length of the edge of the Schottky electrode in Schottky contact with the nitride semiconductor; accordingly, even with the same chip area, it is possible to obtain a forward current larger than that of a conventional diode; and even if the same current value is obtained, the chip area can be made smaller than that of a conventional diode, reducing the substrate cost.

The present invention was made on the basis of the knowledge thus obtained. Embodiments of the present invention will be described below with reference to the accompanying drawings.

First Embodiment

Figure 1:
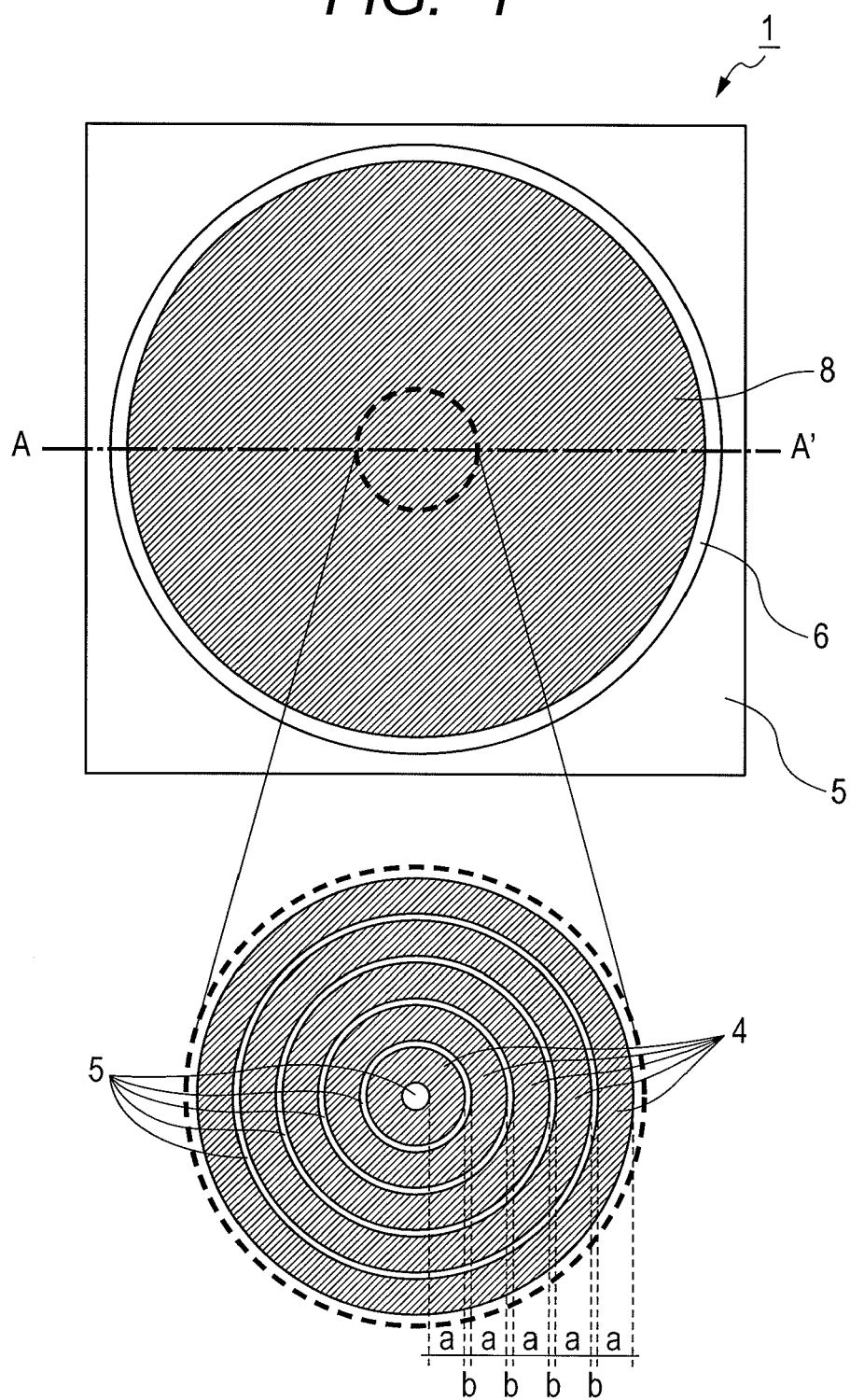
FIG. 1 is a top view of a nitride semiconductor diode according to a first embodiment of the present invention.
Figure 2:
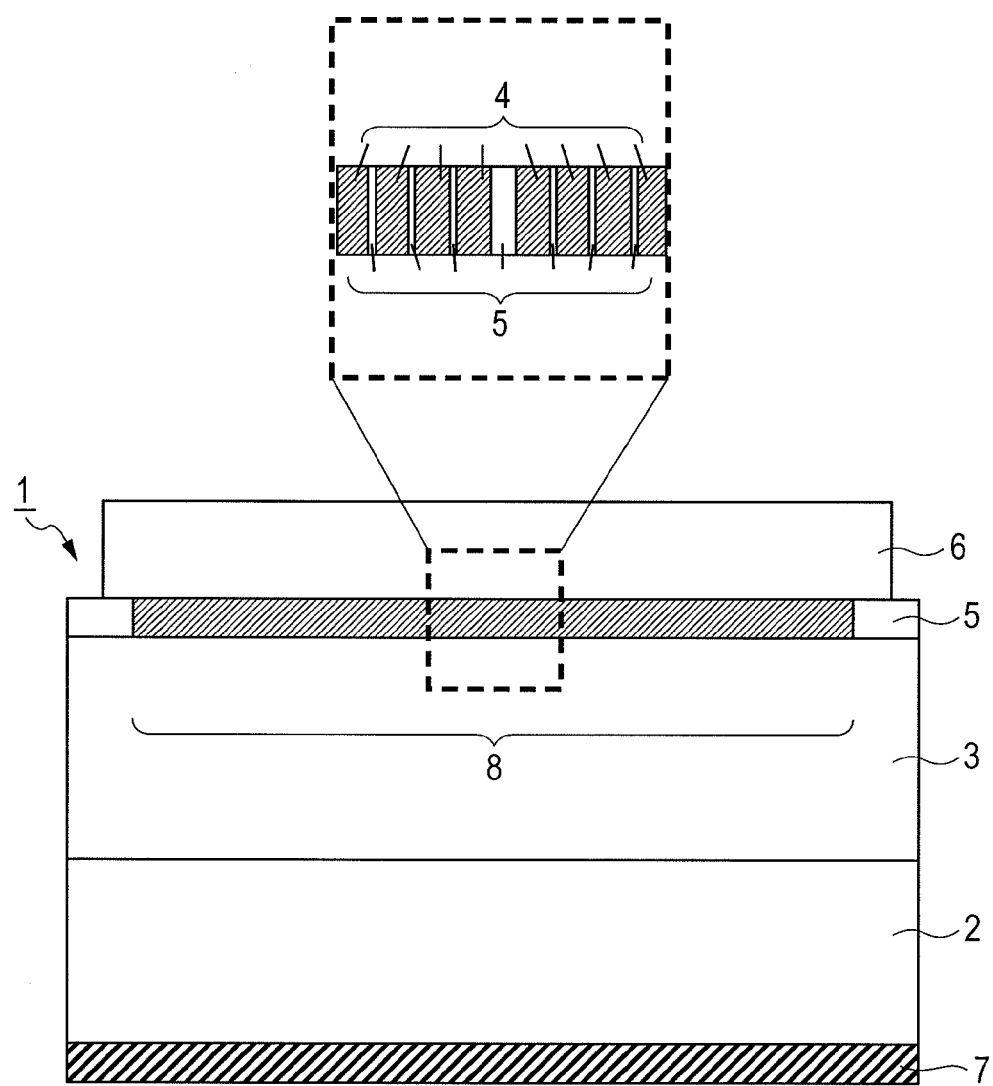
FIG. 2 is a sectional view of the nitride semiconductor diode according to the first embodiment.

Now, a nitride semiconductor diode according to a first embodiment of the present invention will be described. FIG. 1 is a top view of the nitride semiconductor diodes according to this embodiment and FIG. 2 is a sectional view taken along line A-A' of the top view of FIG. 1. Meanwhile, the present invention relates to the shape and structure of a Schottky electrode in Schottky contact with a nitride semiconductor, and the configuration of a layer epitaxially grown on a diode epitaxial substrate described below is the same as that used by the inventors in the experiment. The reason why such a configuration is used is that the advantages of the configuration of the present invention can be easily compared to those of a conventional one. However, the configuration is not limited thereto. In the top view shown in FIG. 1, a Schottky electrode according to the present invention, which is located in a layer below an upper electrode and is in Schottky contact with a nitride semiconductor; is shown using a solid line so that the shape of the Schottky electrode is clarified.

FIGS. 1 and 2 will be described. A nitride semiconductor diode chip 1 according to the first embodiment has a chip size of 600 μm×600 μm. A low-concentration n-type GaN drift layer μ3 is a nitride semiconductor layer disposed on an n-type GaN substrate and has a carrier concentration of $5\times10^{15}$ cm$^{-3}$ and a thickness of 10 μm. As shown in FIG. 1, multilayer, circular Schottky contact electrodes 4 including multiple circular electrodes using the center of the chip as their center each have an electrode width a of 9 μm and made of Pd are formed in contact with the drift layer 3 with a maximum diameter of 500 μm. The circular Schottky contact electrodes 4 here include 25 electrodes (25 layers). The areas shown by the Schottky contact electrodes 4 serve as Schottky junctions according to this embodiment. The circular Pd Schottky contact electrodes 4 are 200 nm thick. The inwardly and outwardly adjacent circular Schottky contact electrodes are uniformly spaced and the distances b therebetween are all 1 μm. Disposed between the circular Schottky contact electrodes as well as on the drift layer 3 outside the outermost circular Schottky contact electrode are a 200-nm-thick SiN films serving as a high-resistance element 5.

Disposed on the circular Schottky contact electrodes 4 and in the desired region on the high-resistance element 5 is a top electrode 6, which includes Ti (100 nm thick)/Au (4000 nm thick). The Schottky contact electrodes in Schottky contact with the nitride semiconductor are electrically connected together by the top electrode 6, forming an anode electrode. Disposed on the back surface of the n-type GaN substrate 2 is a cathode electrode 7, which is a Ti/Al electrode in ohmic contact with the n-type GaN substrate 2.

Reference sign 8 represents a Schottky electrode formation region. Where a Schottky electrode includes multiple electrodes, the Schottky electrode formation region is the region inside a shape having the shortest length of some shapes surrounding all the Schottky electrodes when seen from above. In the first embodiment, the Schottky electrode formation region 8 is defined as the region inside a curve representing the outer edge of the outermost circular Schottky contact electrode. In other words, as shown in FIG. 2, the Schottky electrode formation region 8 can be defined as the region inside the boundary between the outer edge of the Schottky contact electrodes 4 and the high-resistance element 5. The perimeter of the Schottky electrode formation region is the perimeter of the shape having the smallest length. In an ordinary diode including a single Schottky contact electrode, the region 8 is represents the area where the Schottky contact electrode is formed. In the first embodiment, the Schottky electrode formation region 8 of the nitride semiconductor diode chip 1 is the circular region having a diameter of 500 μm, which is the maximum diameter of the circular Schottky contact electrodes 4 when seen from above.

In the nitride semiconductor diode according to the first embodiment, although the area of the Schottky junction of the Schottky contact electrode and the nitride semiconductor is about 0.9 times that in a conventional nitride semiconductor diode, the Schottky contact electrode is formed into separated 25 circular Schottky contact electrode each having inner and outer edges. Thus, the total length (perimeter) of the edges of the 25 circular Schottky contact electrodes is about 40 mm, which is about 25 times longer than the perimeter of the Schottky electrode formation region having a diameter of 500 μm.

According to the knowledge on which the present invention is based, described at the commencement of DETAILED DESCRIPTION OF THE PREFERRED EMBODIMENTS, a current close to 7 A is obtained at a forward voltage of 1.5 V in the converted characteristic shown in FIG. 14 even when the area of the Schottky electrode formation region is as small as a diameter of 500 μm.

In the first embodiment, the electrode width a of each concentric circular Schottky electrode is set to 9 μm. However, since the present invention is intended to increase the total length (perimeter) of the edges of Schottky electrodes in Schottky contact with a nitride semiconductor in a predetermined Schottky electrode formation region, the electrode width a may be larger or smaller than 9 μm depending on the area and shape of the Schottky electrode formation region. Further, in this embodiment, the multiple Schottky electrodes are disposed in order to increase the total length of the edges. However, such a structure is intended to make the present invention easy to understand, and increasing the total length of the edges does not necessarily require disposition of multiple electrodes. Nevertheless, disposing multiple electrodes is advantageous in that the total length of the edges of the Schottky electrode can be increased efficiently.

On the other hand, in consideration of the use of a low-cost production facility, the ease of the manufacturing process, and heat dissipation property, the minimum of the distances b between the multilayer concentric circular Schottky electrodes according to this embodiment preferably falls within a range of 1 μm or more and 10 μm or less and is more preferably about 1 μm. Further, the distances b need not necessarily be the same, in other words, the Schottky electrodes need not necessarily be spaced uniformly. While there may be different widths, all the electrode widths b preferably fall within a range of 1 μm or more and 5 μm or less so as not to waste space. Further, it is preferable not to dispose an ohmic electrode in the Schottky electrode formation region so as not to waste space, in other words, it is preferable to dispose only Schottky electrodes there.

In this embodiment, the top electrode 6 includes Ti/Au, and the Au film is as thick as 4000 nm. This is because, in making wire connection using Au wires, allowing the thick Au film to buffer the load imposed during wire bonding can reduce the physical adverse effect on the Schottky junctions. To accomplish this, the top electrode preferably has a thickness of at least 1 μm or more. Even when flip chip bonding is performed using solder or the like, bonding can be achieved owing to the thick Au film without problem. The Schottky electrode formation region 8 according to the first embodiment has a circular shape when seen from the substrate surface. Alternatively, to reduce the load imposed during wire bonding, the top electrode may be formed into, for example, a rectangular shape slightly smaller than the chip area rather than a circular shape, and the positions of wire connection using Au wires may be in regions close to chip corners outside the Schottky electrode formation region. Further, if the Au film having high thermal conductivity is further thickened to over 4000 nm, the property of dissipating heat generated during operation of the diode is advantageously further enhanced. Further, even when other high-thermal, conductivity, low-resistance metals such as low-cost Cu and Al are used instead of expensive Au, similar advantages can be obtained.

While the Pd monolayer is used as the material for the Schottky electrodes in this embodiment, Ni, Pt, or the like may be used as a material by which a high Schottky barrier height can be obtained. In this case, Pd, Ni, or Pt is only required to be the Schottky junction interface with the nitride semiconductor. Then by laminating a high-melting point metal, such as Ti, Zr, Hf, V, Nb, W, Mo, or Ta, on the interface layer as a diffusion barrier layer and then a metal having high thermal conductivity and a low resistance, such as Au, Cu, or Al, on the diffusion barrier layer, multilayer Schottky electrodes may be formed. As seen, the material and structure of the Schottky electrode and the top electrode can be changed depending on the desired performance, structure, cost, or the like and are not limited to particular ones.

In the first embodiment, the total length of the edges of the Schottky electrodes in contact with the surface of the nitride semiconductor layer is made longer than the perimeter of the Schottky electrode formation region. Thus, a larger current can be obtained at the same forward voltage than that in a diode where the Schottky electrode formation region is formed by a single Schottky electrode, that is, in a diode where the perimeter of the Schottky electrode formation region and the length of the edge of the Schottky electrode are equal to each other. Further, by applying the present invention, the chip size can be reduced at the same amount of current as that of a conventional Schottky diode. That is, both acquisition of a large forward current and a reduction in chip area can be achieved.

In the first embodiment, the drift layer 3 is a layer epitaxially grown on the entire surface of the substrate 2, and the surface of the drift layer 3 is physically processed by etchback, selective growth, or the like. This eliminates the need to form recesses on the substrate surface. Further, the diode is formed without forming a p-type semiconductor region on a part of the surface of the drift layer 3. In this way, without complicating the process, a low-cost, good Schottky barrier diode can be formed. Further, the above-mentioned physical processing allows formation of a diode without significantly increasing the distances between the Schottky electrodes. This is advantageous in that the chip area can be reduced.

Second Embodiment

Figure 3:
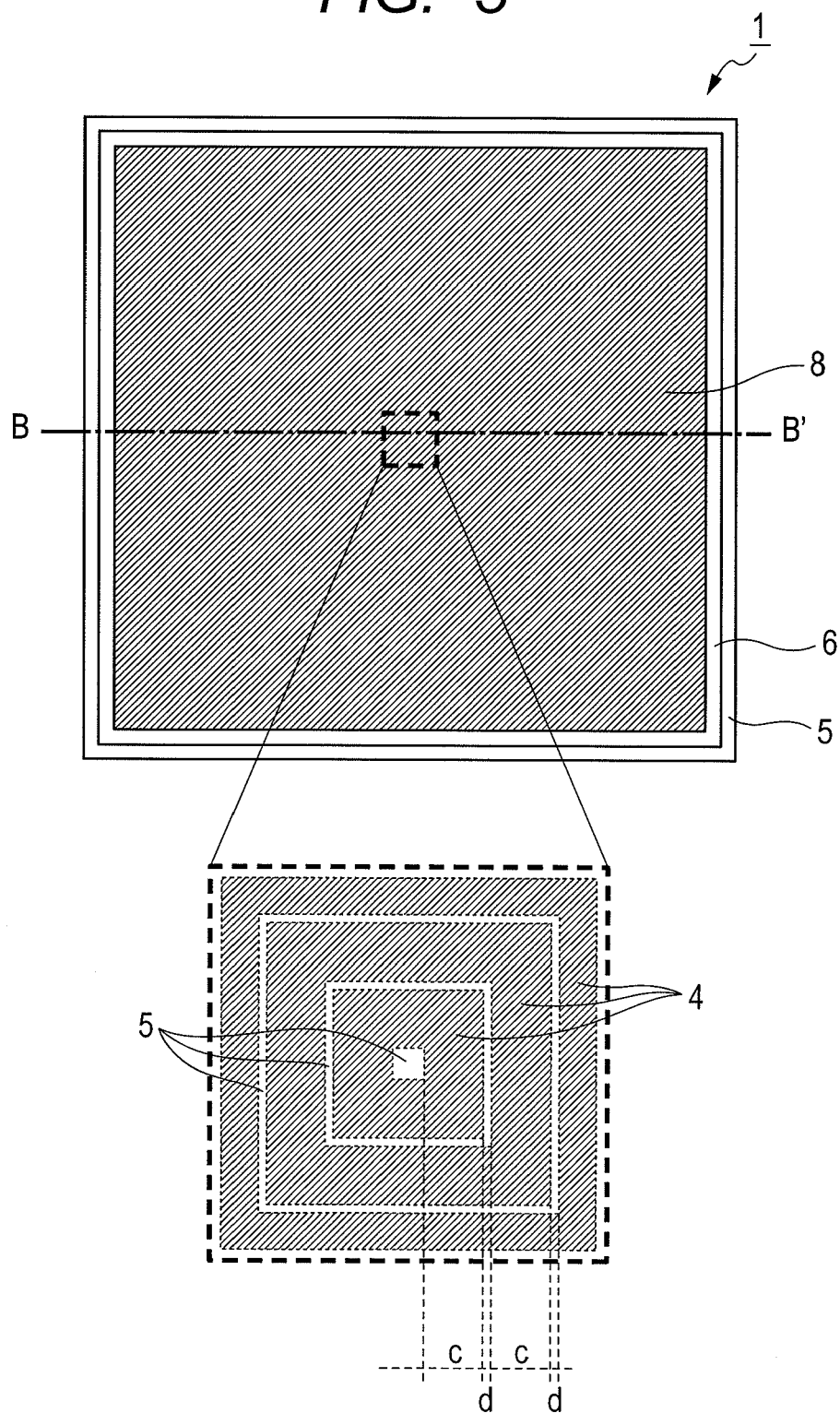
FIG. 3 is a top view of a nitride semiconductor diode according to a second embodiment of the present invention.
Figure 4:
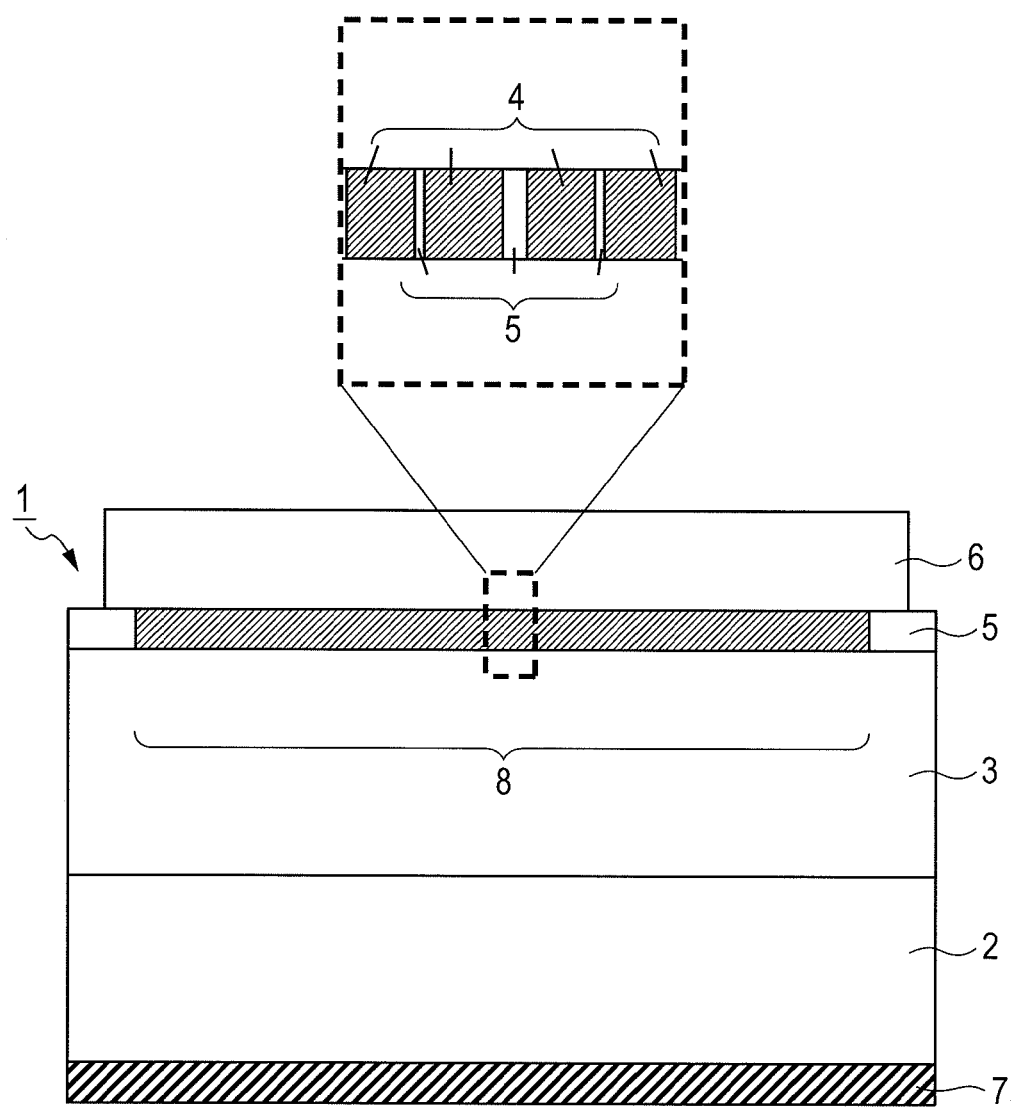
FIG. 4 is a sectional view of the nitride semiconductor diode according to the second embodiment.

Now, a nitride semiconductor diode according to a second embodiment of the present invention will be described. FIG. 3 is a top view of the nitride semiconductor diode according to this embodiment and FIG. 4 is a sectional view taken along line B-B' of the top view of FIG. 3. The configuration of an epitaxial growth layer on a diode epitaxial substrate according to the second embodiment is the same as that according to the first embodiment but is not limited thereto, as described above.

FIGS. 3 and 4 will be described. A nitride semiconductor diode chip 1 according to this embodiment has a chip size of 5 mm×5 mm. A low-concentration n-type GaN drift layer 3 is a nitride semiconductor layer disposed on an n-type GaN substrate 2 and has a carrier concentration of $5 \times 10^{15}$ cm$^{-3}$ and a thickness of 10 μm. As shown in FIG. 3, each of Schottky junctions of multilayer Pd Schottky contact electrodes 4 (concentric square Schottky contact electrodes) with a surface of the n-type GaN drift layer 3 has a shape obtained by folding and closing a long length having an electrode width c of 68 μm into a square. The Schottky contact electrodes 4 are formed from the chip center to a region of a maximum 4.9 mm×4.9 mm with the chip center used as their center, as shown in the diagram. The number of the Schottky contact electrodes 4 here is 35 (35 layers). The regions shown by the Schottky contact electrodes 4 serve as Schottky junctions according to this embodiment. The Pd film serving as the multilayer Schottky contact electrodes 4 is 500 nm thick.

The distances d between the inwardly and outwardly adjacent Schottky contact electrodes 4 are all 2 μm. Disposed between the Schottky contact electrodes 4 as well as on the n-type GaN drift layer 3 outside the outermost Schottky contact electrodes 4 is a 500-nm-thick SiO$_2$ film serving as a high-resistance element 5. Disposed on the circular Schottky contact electrodes 4 as well as in the desired region on the high-resistance element 5 is a top electrode 6 including Ni (200 nm thick)/Cu (6000 nm thick). The 35 Schottky contact electrodes 4 are electrically connected together by the top electrode 6. Disposed on the back surface of the n-type GaN substrate 2 is a cathode electrode 7, which is a Ti/Al electrode in ohmic contact with the n-type GaN substrate 2.

The Schottky electrode formation region 8 of the nitride semiconductor diode chip 1 is a rectangular area having a maximum size of 4.9 mm×4.9 mm and having the 35 circular Schottky contact electrodes disposed thereon when seen from above the chip. In the nitride semiconductor diode according to this embodiment, the inner and outer edges of the 35 Schottky contact electrodes make Schottky junctions with the nitride semiconductor. The total length (perimeter) of the inner and outer edges of the 35 Schottky electrode edges is about 687 mm, which is about 35 times longer than the perimeter of the Schottky electrode formation region. On the other hand, the total area of the Schottky junctions is smaller than that of a conventional structure to a lesser extent.

In this embodiment, considering the effect of heat generated by drive of a large forward current, each Schottky junction is formed into a shape obtained by folding and closing the long length into a square. The junction width c of one of the Schottky junctions (=the Schottky contact electrodes 4 in Schottky contact with the nitride semiconductor) is set to 68 μl. Since the maximum width of the Schottky junction depends on the chip area and the desired forward characteristics, the upper limit is not particularly set. However, the width c is preferably 5 μm or more and 500 μm or less.

If ratio of the total length of the Schottky junctions to the perimeter of the Schottky electrode formation region (perimeter ratio) is at least more than 1:1, it can be said that an element resistance reduction effect could be obtained, in terms of the intent of the present invention. However, if the perimeter ratio is as small as 2:1 or 3:1, it cannot be said that an expected significant effect could be obtained or that the chip area could be significantly reduced compared to that of a conventional structure. In this case, it is difficult to realize a nitride semiconductor diode having a reduced chip area for cost reduction. Accordingly, to obtain an advantage of the present invention to a significant degree, the perimeter ratio is preferably 10:1 or more, more preferably 20:1 or more. This requires that the width of the Schottky junction be determined in accordance with the size of the Schottky electrode formation region. Accordingly, the width is not limited to the above-mentioned one.

As described above, in this embodiment, the multiple Schottky junctions obtained by folding and closing the long lengths into shapes having four corners (squares) are disposed concentrically. However, the shape of the Schottky junctions depends on the shape and area of the chip and the shape and area of the Schottky electrode formation region. Accordingly, not only squares but also any concentric shapes such as regular triangles, isosceles triangles, regular hexagons, regular triacontahexagons, rectangles, trapezoids, rhombuses, and the like may be disposed without departing from the scope of the present invention.

In this embodiment as well as in the Schottky junctions according to the first embodiment, the distances between the concentric adjacent Schottky junctions are set to the same size (2 μm). However, the distances need not necessarily be the same. For example, the distances between the concentric adjacent Schottky junctions around the center of the Schottky electrode formation region may be shorter and the distances between the concentric adjacent Schottky junctions close to the perimeter of the region may be longer. Although the distances need not be the same, d is preferably 1 μm or more and 10 μm or less.

Further, the distances between the concentric adjacent Schottky junctions, that is, the widths of the high-resistance elements need not be a larger size than necessary. Rather, as the size increases, the total area of the Schottky junctions with the nitride semiconductor is reduced, increasing the rising voltage in the forward characteristics. Accordingly, although the size need not be set particularly, it is appropriate to control the size to 10 μm or less at most in accordance with the size of Schottky electrode formation region.

The corners of the inner and outer edges of the Schottky junctions according to this embodiment are preferably in the form of an arc having R. This is because, in the Schottky junctions, the electric field tends to concentrate on the corners having an obtuse angle, a right angle, or an acute angle rather than on smooth curves or straight lines adjacent to the corners, which may cause a reduction in backward withstand voltage. Since the minimum width of the Schottky junction is 1 μm, it is appropriate to set the minimum radium of the arc to 1 μm as well.

Third Embodiment

Figure 5:
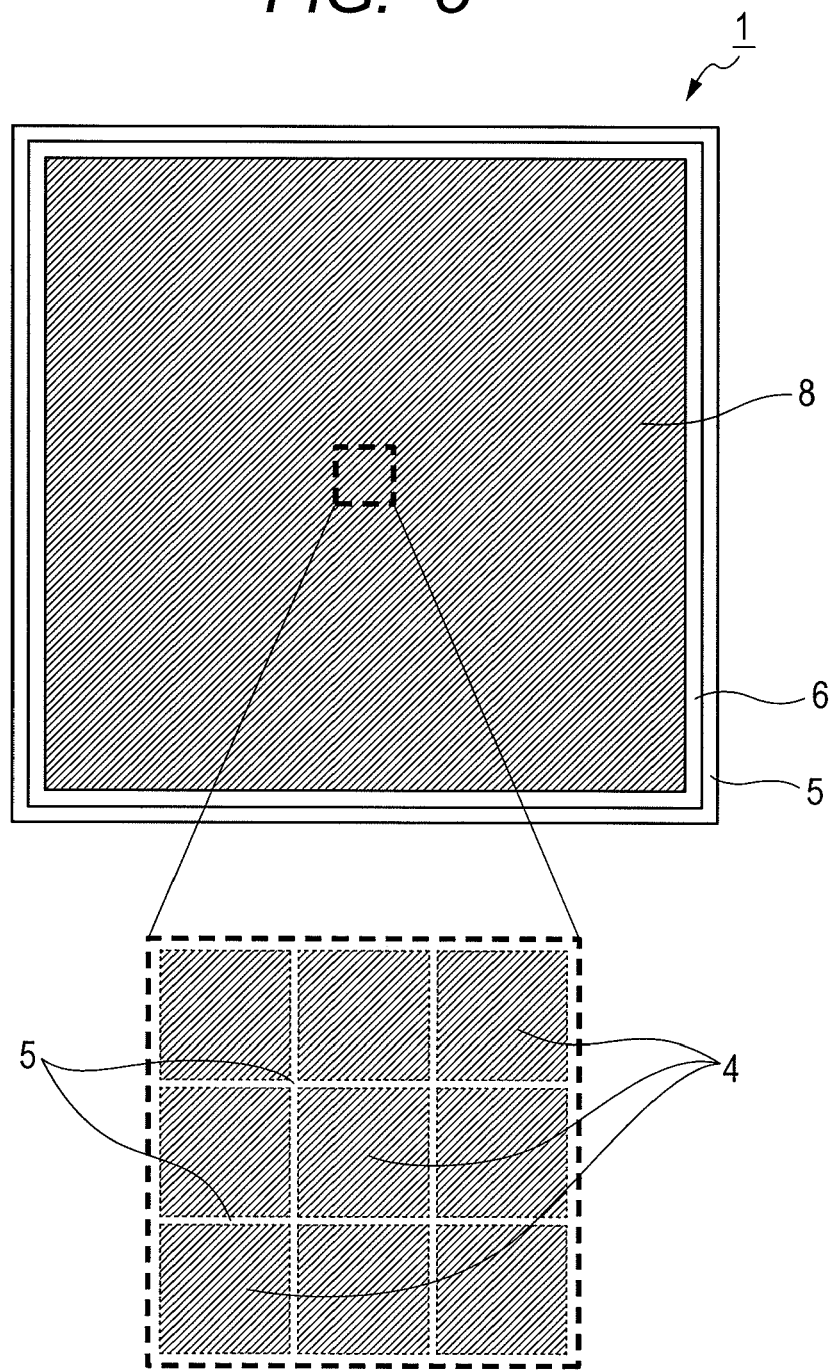
FIG. 5 is a top view of a nitride semiconductor diode according to a third embodiment of the present invention.

A nitride semiconductor diode according to a third embodiment of the present invention is shown in FIG. 5 (plan view). In this nitride semiconductor diode, rectangular Schottky contact electrodes 4 having a size of 99 μm×99 μm, instead of the concentric multilayer (concentric circular) Schottky contact electrodes 4 in the first and second embodiments, are disposed on a Schottky electrode formation region 8 at intervals of 1 μm. The other components are all the same as those of the second embodiment.

In this embodiment, the total of 2401 rectangular Schottky electrodes having a size of 99 μm×99 μm are disposed in the Schottky electrode formation region having a size of 4.9 mm×4.9 mm. The total length (perimeter) of the edges of the Schottky junctions is about 950 mm, which corresponds to about 48.5 times the perimeter of the Schottky electrode formation region. According to the above-mentioned advantage of the present invention, the element resistance is further reduced, obtaining a large forward current.

In this embodiment, which is another example for increasing the total length (perimeter) of the edges of the Schottky electrodes, the separated multiple rectangular Schottky junctions having a size of 99 μm×99 μm are disposed in the predetermined Schottky electrode formation region, as described above. Needless to say, the shape of Schottky electrodes to be disposed is not limited to a rectangle and may be any shape such as a circle, a triangle, or a hexagon. In this embodiment, the length of one side of the rectangular Schottky junction is set to 99 μm. For the same reason as that mentioned regarding the above concentric circular Schottky electrodes, the length of the diagonal of a polygon having an even number of corners is preferably 1 μm or more. The length of a normal from one corner to an opposing side of a polygon having an odd number of corners is preferably 1 μm or more. However, the upper limit of these lengths is not set.

Fourth Embodiment

Now, a nitride semiconductor diode according to a fourth embodiment of the present invention will be described. FIG.

Figure 6:
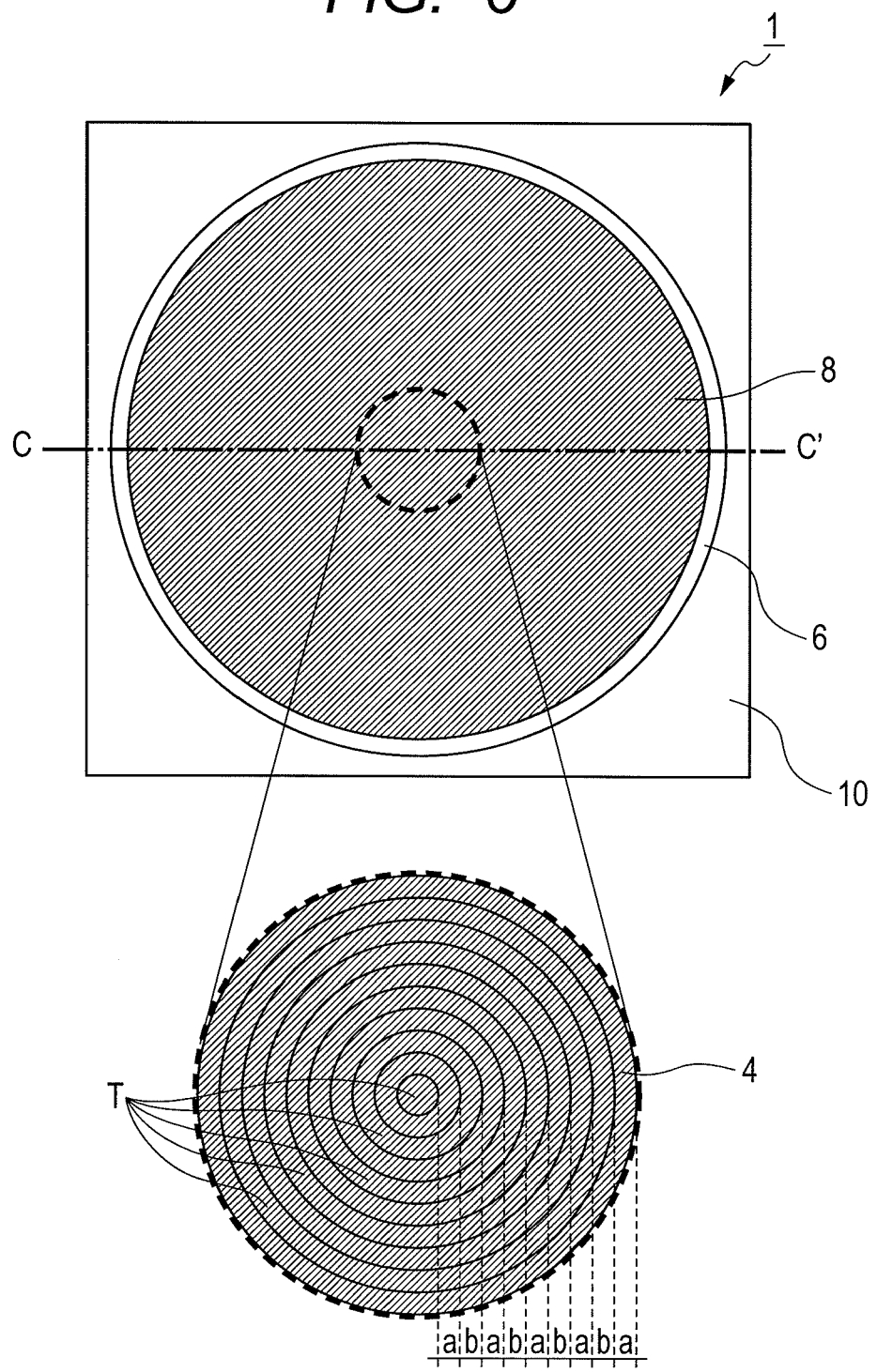
FIG. 6 is a top view of a nitride semiconductor diode according to a fourth embodiment of the present invention.
Figure 7:
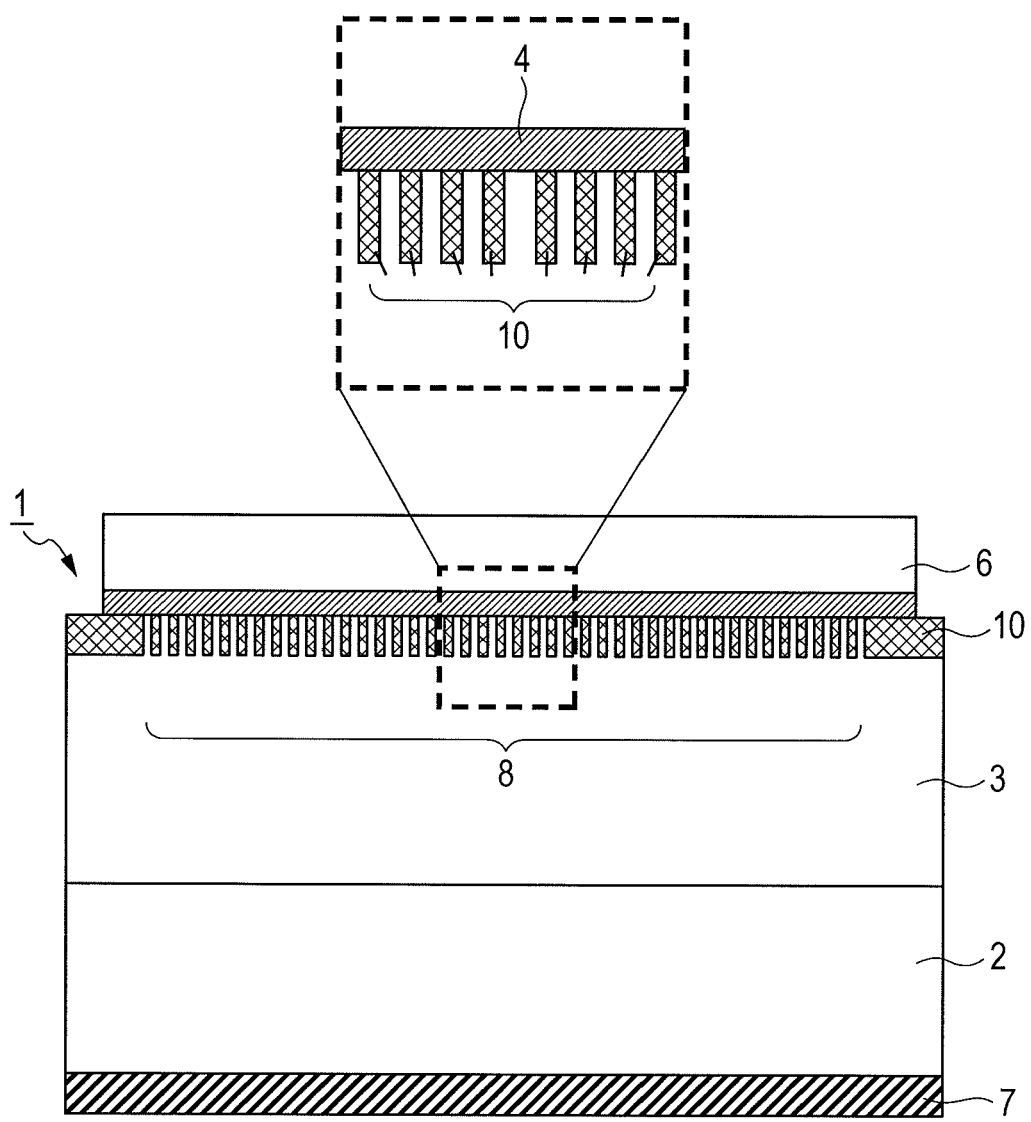
FIG. 7 is a sectional view of the nitride semiconductor diode according to the fourth embodiment.

6 is a top view of a nitride semiconductor diode according to this embodiment and FIG. 7 is a sectional view taken along line C-C' of the top view of FIG. 6. In the fourth embodiment, unlike in the first to third embodiments, the total length of the edges of the Schottky electrodes in contact with the surface of the nitride semiconductor layer is not increased. Instead, the total length is increased by etching back a part of the surface of the nitride semiconductor layer. Specifically, to form the edge of the Schottky contact electrode, the desired region of a low-concentration n-type drift layer 3 is selectively concentrically etched to form a partial trench (T in the drawing) structure (recesses). As shown in FIG. 7, the trench structure is filled with an insulating film 10. As shown in FIG. 7, portions of a Schottky junction are formed on the insulating film. The formation of such trenches can make junctions of the surface of the nitride semiconductor layer and the Schottky electrode without having to dispose multiple Schottky electrodes. Thus, similar advantages to those of the first to third embodiments can be obtained. In this embodiment, the width a of the surfaces of the drift layer on which the Schottky contact electrode is formed is set to 5 μm, and the width b of the trenches is set to 5 μm as well. In the formation of trenches, the width a is preferably 5 μm or more and 500 μm or less, and the width b is preferably 1 μm or more and 10 μm or less.

Where trenches are formed on the nitride semiconductor layer, the Schottky electrode formation region is the region inside a shape having the smallest length of some shapes surrounding the drift layer formed outside the region having the trenches formed thereon when seen from above. Accordingly, the perimeter is the perimeter of the shape having the shortest length. That is, in the fourth embodiment, the perimeter is defined not as the edge of the Schottky electrode 4 but as the boundary between the outermost drift layer surface, which is inside the edge of the Schottky electrode 4, and the Schottky junction 4. In the fourth embodiment also, the total length of the edges of the Schottky electrode in contact with the surfaces of the nitride semiconductor layer is made longer than the perimeter of the Schottky electrode formation region. Thus, a larger amount of current can be obtained at the same forward voltage than that in an element where the drift layer surface is not etched and a single Schottky electrode is formed. Further, by applying the present invention, the chip size can be reduced at the same amount of current as that of a conventional Schottky diode. That is, both acquisition of a large forward current and a reduction in chip area can be achieved.

The diode according to the fourth embodiment is a diode where a drift layer is formed on an entire surface of a substrate and a surface of the drift layer is etched. This diode is formed without using crystal growth technology such as selective growth or the like or forming a p-type semiconductor region on the surface of the drift layer. In this way, a low-cost, good Schottky barrier diode can be formed without having to add processes associated with a crystal growth process. Further, since the trench width b is set to 2 μm or less, the distances between the drift surfaces are not significantly increased. This makes it possible to form a diode having good characteristics while reducing the chip area.

While the recesses are concentric and circular in the fourth embodiment, the recesses may be formed in mesh so that the total length of the edges of the Schottky electrode in contact with the surfaces of the nitride semiconductor layer is increased, as in the third embodiment.

Fifth Embodiment

Figure 8:
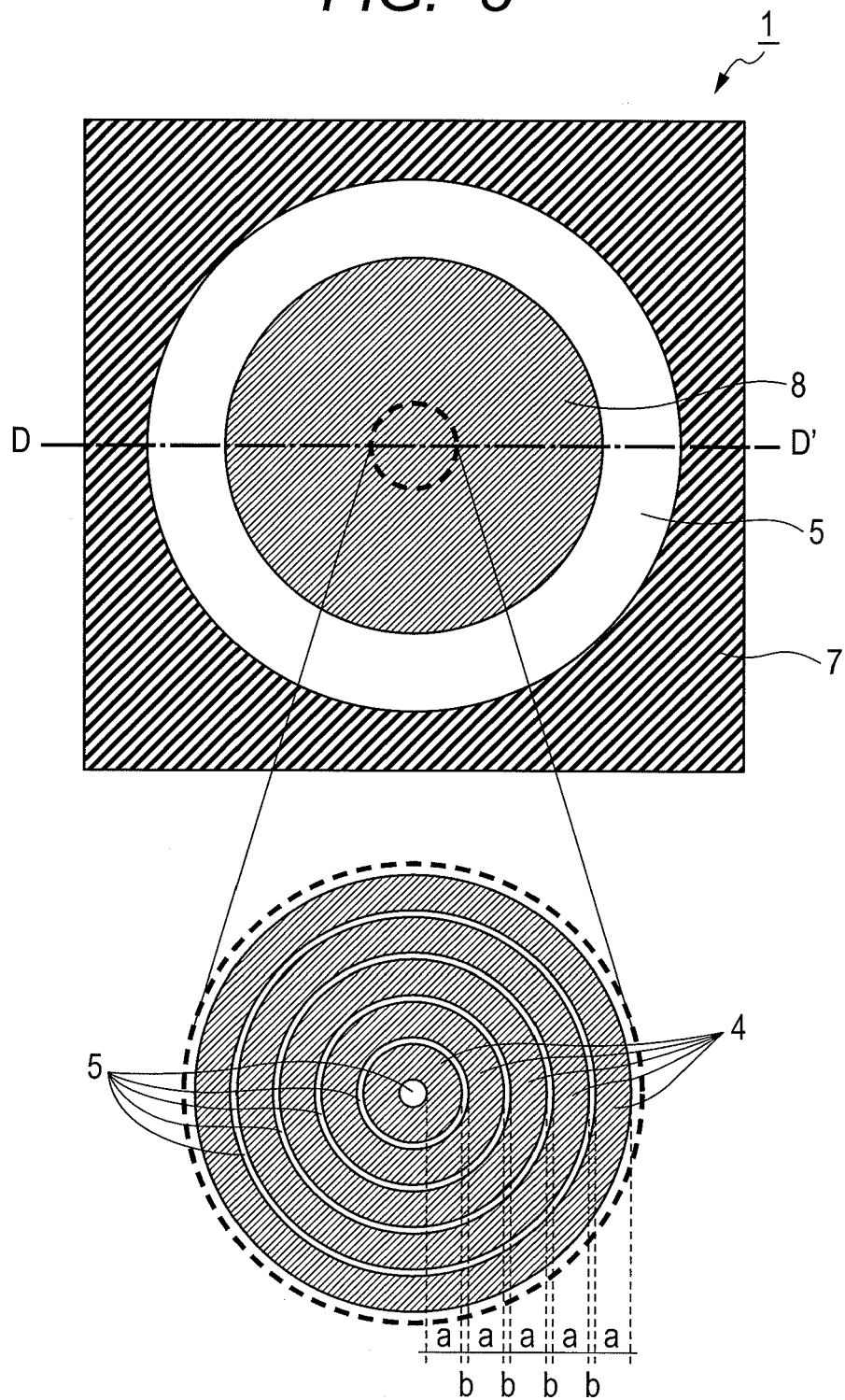
FIG. 8 is a top view of a nitride semiconductor diode according to a fifth embodiment of the present invention.
Figure 9:
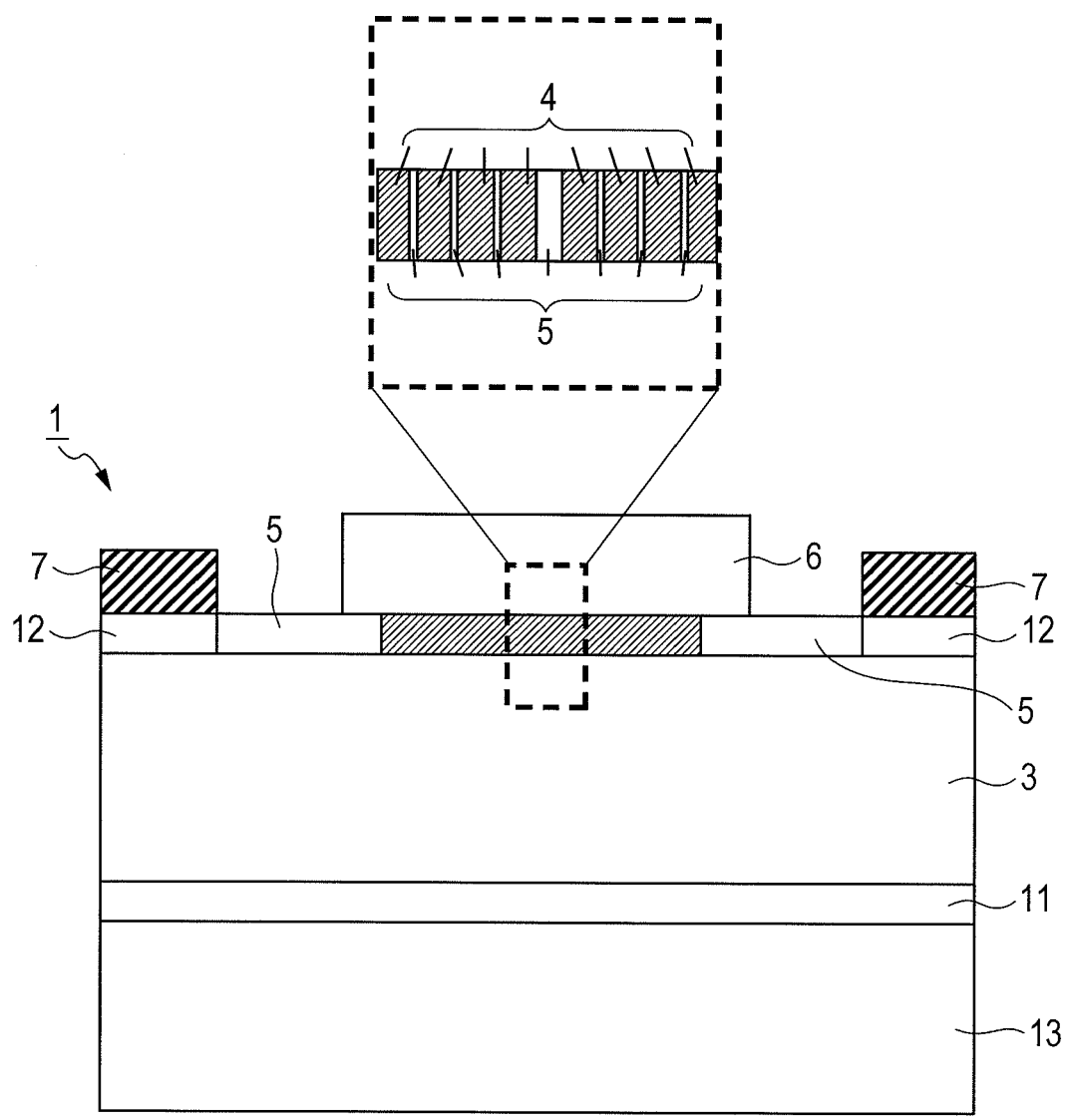
FIG. 9 is a sectional view of the nitride semiconductor diode according to the fifth embodiment.

Now, a nitride semiconductor diode according to a fifth embodiment of the present invention will be described. FIG. 8 is a top view of a nitride semiconductor diode 1 according to this embodiment and FIG. 9 is a sectional view taken along line D-D' of the top view of FIG. 8. This embodiment is not a vertical diode where a current flows in the vertical direction of the substrate, as described above, but an example of a lateral diode where a current flows in the lateral direction thereof.

In this diode, a low-concentration n-type GaN drift layer 3 having a carrier concentration of $1 \times 10^{16}$ cm$^{-3}$ and a thickness of 5 μm and a high-concentration n-type GaN contact layer 12 having a carrier concentration of $1 \times 10^{18}$ cm$^{-3}$ and a thickness of 200 nm are epitaxially grown on a sapphire substrate 13 with a buffer layer 11 between the sapphire substrate 13 and the drift layer 3.

The diode has a chip area of 1 mm×1 mm and a rectangular shape. The region of 700 μm from the chip center of the high-concentration n-type GaN contact layer 12 is eliminated by known nitride semiconductor dry etching, exposing the below low-concentration n-type GaN drift layer 3.

Disposed on the n-type GaN drift layer 3 are multilayer circular Pd Schottky contact electrodes 4 composed of multiple tubes using the chip center as their center, as shown in the first embodiment, and having an electrode width a of 9 μm, as shown in FIG. 1. The Schottky contact electrodes 4 are formed up to a maximum diameter of 500 μm. The circular Schottky contact electrodes 4 are composed of 25 electrodes (25 layers), as in the first embodiment. The distances b between the concentric adjacent circular Schottky contact electrodes are all 1 μm, as shown in FIG. 1. Disposed between the circular Schottky electrodes 4 as well as on the n-type GaN drift layer 3 outside the outermost circular Schottky contact electrodes 4 are 200 nm-thick SiN films serving as high-resistance elements 5.

Disposed on the circular Schottky contact electrodes 4 and in the desired region on the high-resistance element 5 is a top electrode 6 composed of Ti (100 nm thick)/Au (4000 nm thick). The circular Schottky contact electrodes 4 are electrically connected together by the top electrode 6, forming an anode electrode. Disposed on the high-concentration n-type GaN contact layer 12 located on the outside of the chip is a cathode electrode 7, which is an Ti/Al electrode in ohmic contact with the contact layer 12.

The Schottky electrode formation region 8 of the nitride semiconductor diode 1 is a circular region having a diameter of 500 μm, which is the maximum diameter of the circular Schottky electrodes 4 when seen from above.

The lateral diode according to this embodiment can reduce the element resistance to about two-third that of conventional lateral diode having a conventional Schottky electrode (a diameter of 500-μm-diameter circular electrode) on a lateral diode epitaxial substrate. The forward current of a lateral diode mainly flows through the edge of a Schottky contact electrode in contact with a semiconductor. Application of the configuration of the Schottky contact electrode according to this embodiment to a lateral diode can advantageously reduce the element resistance compared to that of a conventional Schottky electrode structure. Further, increasing the concentration or thickness of the low-concentration n-type GaN drift layer increases the forward voltage increase effect owing to the Schottky contact electrode structure according to this embodiment.

While the sapphire substrate is used as the substrate in the above-mentioned embodiment, where the present invention is applied to a lateral diode, an SiC substrate, a silicon substrate, or the like may be used.

Sixth Embodiment

Figure 10:
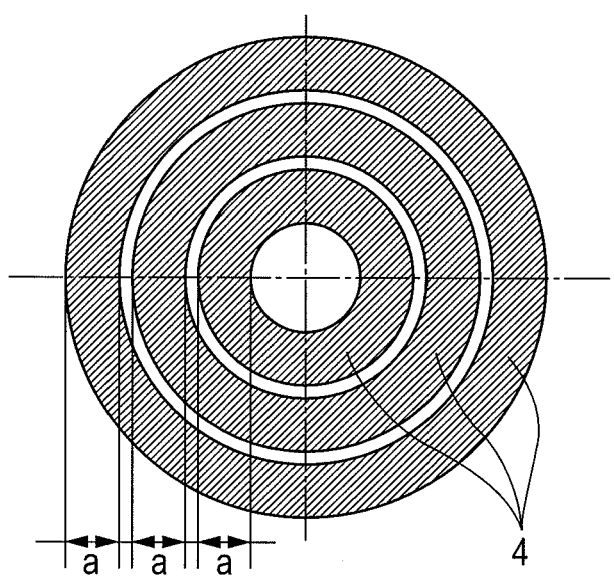
FIG. 10 is a top view of a Schottky electrode according to a sixth embodiment of the present invention.

Now, another aspect of the concentric circular Schottky junctions according to the first, second, and fifth embodiments will be described as a sixth embodiment. FIG. 10 shows an example of the shape of Schottky junctions composed of multiple concentric circles. This drawing shows the shape of Schottky junctions composed of three concentric circles each having the width a of 5 μm.

Figure 11:
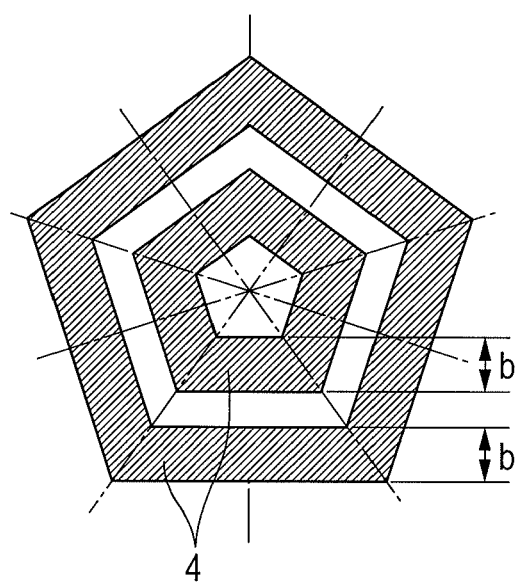
FIG. 11 is a top view of a Schottky electrode according to the sixth embodiment.

FIG. 11 shows an example of the shape of Schottky junctions composed of multiple concentric polygons each having a shape obtained by folding and closing a long length having the desired width so that corners are formed in the desired positions. The drawing shows the shape of Schottky junctions composed of two concentric regular pentagons each obtained by folding and closing a long length having the width b of 10 μm.

Figure 12:
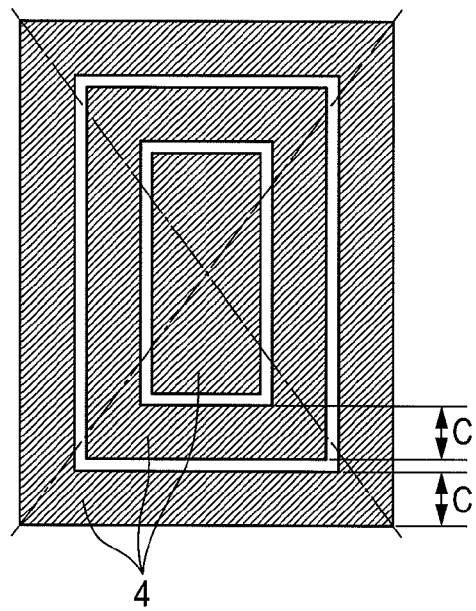
FIG. 12 is a top view of a Schottky electrode according to the sixth embodiment.

FIG. 12 shows the shape of Schottky junctions composed of three concentric rectangles each obtained by folding and closing a long length having the width c of 20 μm. As shown in the drawing, one of the Schottky junctions is present in the center, and the Schottky junctions have a three-layer structure including this Schottky junction. A two-layer structure where the outermost Schottky junction of FIG. 12 is not present and an electrode is disposed in the center is also considered as being concentric circular in this specification. Note that the above-mentioned long length width c need not be applied to the size of this centered Schottky junction.

While the different shapes of the Schottky junctions have been described above, the shape of the Schottky junctions is not limited thereto. Any shape conforms to the intent of the present invention as long as the shape includes polygons such as triangles, hexagons, or octagons or composed of concentric and similar shapes. Any shape can be used if the total length of the edges of the Schottky electrodes in contact with the surface of the nitride semiconductor layer is longer than the perimeter of the Schottky electrode formation region. The ratio between these lengths is preferably 10:1 or more, more preferably 20:1 or more.

While the nitride semiconductor layer is made of gallium nitride (GaN) in the above-mentioned embodiments, a common aluminum gallium nitride (AlGaN) may be used as an alternative. For AlGaN, the band gap becomes larger than that in GaN by increasing the Al composition ratio. Thus, if a drift layer to be in contact with a Schottky electrode is formed using, e.g., a low-concentration n-type AlGaN, the withstand voltage will be effectively increased.

What is claimed is:

1. A nitride semiconductor diode comprising:
    a substrate;
    an n-conductivity-type nitride semiconductor layer disposed on the substrate;
    a Schottky electrode structure that is disposed on a surface of the nitride semiconductor layer and makes a Schottky junction with the surface of the nitride semiconductor layer, the Schottky electrode structure having one or more contact regions in contact with the nitride semiconductor layer; and
    an ohmic electrode in ohmic contact with the nitride semiconductor layer, wherein
    a total length of edges of the one or more contact regions of the Schottky electrode structure is greater than a perimeter of a Schottky electrode formation region of the Schottky electrode structure.

2. The nitride semiconductor diode according to claim 1, wherein the Schottky electrode structure comprises a plurality of electrodes, and the perimeter is that of a shape having the shortest perimeter surrounding all the Schottky electrodes in plan view.

3. The nitride semiconductor diode according to claim 1, wherein the total length is at least 10 times the perimeter.

4. The nitride semiconductor diode according to claim 1, wherein the total length is at least 20 times the perimeter.

5. The nitride semiconductor diode according to claim 1, wherein the Schottky electrode structure comprises a plurality of electrodes.

6. The nitride semiconductor diode according to claim 5, wherein the Schottky electrodes are formed in such a manner that the Schottky electrodes are concentric and circular in plan view.

7. The nitride semiconductor diode according to claim 6, wherein distances between the adjacent concentric and circular electrodes are each 1 μm or more and 10 μm or less.

8. The nitride semiconductor diode according to claim 5, wherein the nitride semiconductor layer is a layer epitaxially grown on an entire surface of the substrate.

9. The nitride semiconductor diode according to claim 8, wherein the total length is at least 10 times the perimeter.

10. The nitride semiconductor diode according to claim 1, wherein the ohmic electrode is formed on a back surface of the substrate.

11. The nitride semiconductor diode according to claim 1, wherein the nitride semiconductor layer is not subjected to etch-back or selective growth.

12. The nitride semiconductor diode according to claim 1, wherein a recess structure is formed on a surface of the nitride semiconductor layer, the recess structure is filled with an insulating film, and the Schottky electrode is partially formed on the insulating film.

13. The nitride semiconductor diode according to claim 12,
    wherein the recess structure comprises a plurality of recesses, and
    wherein the recesses are formed concentrically and circularly in plan view.

14. The nitride semiconductor diode according to claim 12, wherein the recess structure is formed by etch-back.

15. The nitride semiconductor diode according to claim 1, wherein the nitride semiconductor layer comprises one of gallium nitride and aluminum gallium nitride.

16. The nitride semiconductor diode according to claim 1,
    wherein the ohmic electrode is formed on a surface of the substrate, and
    wherein the substrate comprises one of n-type GaN, sapphire, SiC, and silicon.

17. A nitride semiconductor diode according to claim 1,
    wherein a recess structure is formed on the nitride semiconductor layer, and the perimeter is that of a shape leaving the shortest perimeter surrounding all of the contact regions in plan view.

* * * * *